US009490750B2

(12) United States Patent
Wollesen et al.

(10) Patent No.: US 9,490,750 B2
(45) Date of Patent: Nov. 8, 2016

(54) SYSTEMS AND METHODS FOR PERFORMING DEMODULATION AND MODULATION ON SOFTWARE DEFINED RADIOS

(71) Applicant: Per Vices Corporation, Toronto (CA)

(72) Inventors: Victor Wollesen, Toronto (CA); Yi Yao, Toronto (CA)

(73) Assignee: Per Vices Corporation, Toronto (CA)

( * ) Notice: Subject to any disclaimer, the term of this patent is extended or adjusted under 35 U.S.C. 154(b) by 0 days.

(21) Appl. No.: 14/199,805

(22) Filed: Mar. 6, 2014

(65) Prior Publication Data

US 2014/0185715 A1    Jul. 3, 2014

Related U.S. Application Data

(63) Continuation of application No. PCT/CA2012/050608, filed on Sep. 4, 2012.

(60) Provisional application No. 61/532,685, filed on Sep. 9, 2011.

(30) Foreign Application Priority Data

Mar. 26, 2012    (WO) ................ PCT/CA2012/000314

(51) Int. Cl.
*H04B 1/00*    (2006.01)
*H04W 4/00*    (2009.01)
(Continued)

(52) U.S. Cl.
CPC ............... *H03D 9/00* (2013.01); *H03J 1/0008* (2013.01); *H04B 1/001* (2013.01); *H04B 1/16* (2013.01); *H04L 5/06* (2013.01); *H04L 27/0008* (2013.01)

(58) Field of Classification Search
CPC .............. H04L 25/03343; H04L 2025/03802; H04L 27/2626; H04L 2025/03426; H04L 27/06; H04L 29/02
USPC .......................................... 375/148; 370/334
See application file for complete search history.

(56) References Cited

U.S. PATENT DOCUMENTS 4,501,020 A    2/1985    Wakeman
4,818,949 A    4/1989    Cohen
(Continued)

FOREIGN PATENT DOCUMENTS

WO    9705705 A1    2/1997

OTHER PUBLICATIONS

Huie, "Synthesizing FPGA Corew For Software-Define Radio" published by Altera Corporation, 2005.*
(Continued)

*Primary Examiner* — Daniel Washburn
*Assistant Examiner* — Sarah Hassan
(74) *Attorney, Agent, or Firm* — Thomas Wong; Blake, Cassels & Graydon LLP

(57) ABSTRACT

A system and method are provided for extracting and demodulating one or more channels in a radio signal. The method includes receiving a first radio signal using a radio frequency front end, translating a first band of frequencies of the first radio signal to a second band of frequencies to generate a second radio signal, digitizing the second radio signal to generate a digital signal, extracting one or more additional band of frequencies of the digital signal, each additional band of frequencies corresponding to a channel, and demodulating one or more channels to generate a respective demodulated signal. In another aspect, a system and method are provided for modulating and combining one or more channels into a radio signal.

19 Claims, 7 Drawing Sheets

(51) Int. Cl.
*H03D 9/00* (2006.01)
*H04L 5/06* (2006.01)
*H03J 1/00* (2006.01)
*H04B 1/16* (2006.01)
*H04L 27/00* (2006.01)

(56) References Cited

U.S. PATENT DOCUMENTS

| | | | |
|---|---|---|---|
| 5,289,464 A | 2/1994 | Wang | |
| 5,812,609 A | 9/1998 | McLochlin | |
| 5,970,105 A | 10/1999 | Dacus | |
| 5,999,561 A * | 12/1999 | Naden | H04B 1/707 375/142 |
| 6,166,690 A * | 12/2000 | Lin | G01S 19/21 342/357.59 |
| 6,931,083 B1 * | 8/2005 | Linder | H03D 7/1425 375/345 |
| 6,999,716 B1 * | 2/2006 | Andre | G01S 19/36 370/316 |
| 7,110,435 B1 * | 9/2006 | Sorrells | H03D 7/00 375/147 |
| 7,236,500 B1 | 6/2007 | Greenberg | |
| 7,391,819 B1 * | 6/2008 | von der Embse | 375/295 |
| 8,705,643 B2 * | 4/2014 | Sathananthan et al. | 375/260 |
| 2001/0030940 A1 * | 10/2001 | Hellberg | H04L 5/06 370/210 |
| 2002/0012411 A1 | 1/2002 | Heinzl et al. | |
| 2002/0015439 A1 * | 2/2002 | Kohli | G01C 21/26 375/148 |
| 2003/0021367 A1 * | 1/2003 | Smith | H04B 1/123 375/346 |
| 2003/0236068 A1 * | 12/2003 | Jespersen | H04H 40/90 455/11.1 |
| 2004/0095907 A1 * | 5/2004 | Agee | H04B 7/0417 370/334 |
| 2004/0165564 A1 | 8/2004 | Kim et al. | |
| 2005/0118977 A1 | 6/2005 | Drogi et al. | |
| 2005/0141657 A1 | 6/2005 | Maltsev et al. | |
| 2007/0092045 A1 | 4/2007 | Woo et al. | |
| 2008/0012575 A1 * | 1/2008 | Ebert | H04B 1/126 324/613 |
| 2008/0114247 A1 * | 5/2008 | Urbano et al. | 600/447 |
| 2008/0118011 A1 | 5/2008 | Trachewsky et al. | |
| 2009/0141833 A1 | 6/2009 | Kim et al. | |
| 2009/0323784 A1 | 12/2009 | Depienne et al. | |
| 2010/0157066 A1 | 6/2010 | Challapali et al. | |
| 2012/0121036 A1 * | 5/2012 | Van Renterghem et al. | 375/296 |

OTHER PUBLICATIONS

Qui, R.C. et al.; "Towards a Real-time Cognitive Radio Network Tested: Architecture, Hardware Platform, and Application to Smart Grid"; Fifth IEEE Workshop on Networking Technologies for Software Defined Radio (SDR) Networks; 2010; pp. 1 to 6.

Kim, K. et al.; "Specific Emitter Identification for Cognitive Radio with Application to IEEE 802.11"; IEEE Telecommunications Conference; 2008; pp. 1 to 5.

Van Eck. W.; "Electromagnetic Radiation from Video Display Units: An Eavesdropping Risk?"; Computers & Security 4; 1985; pp. 269 to 286.

Kuhn, M.; "Compromising emanations: eavesdropping risks of computer displays"; Technical Report No. 577; University of Cambridge Computer Laboratory; Dec. 2003; http://www.cl.cam.ac.uk/TechReports/; ISSN: 1476-2986.

Kuhn, M; "Electromagnetic Eavesdropping Risks of Flat-Panel Displays"; 4th Workshop on Privacy Enhancing Technologies; May 2004.

Che, S. et al.; "Accelerating Compute-Intensive Applications with GPUs and FPGAs; IEEE Symposium on Application Specific Processors (SASP)"; Jun. 2008.

Pawelczak, P.; "Technical Challenges of Cognitive Radio-Related systems"; First Annual Conference on Competition and Regulation in Network Industries; 2008.

Product Information Sheet for USRP N200 Series Ethernet Software Radio Systems; published at least as early as Mar. 23, 2011; Ettus Research.

Huie, J. et al.; "Synthesizing FPGA Cores for Software-Defined Radio"; 2005; Altera Corporation.

Cyclone II FFT Co-Processor Reference Design, Application Note 375; Version 1.0; May 2005; Altera Corporation.

Tsoi, K. et al.; "Axel: A Heterogeneous Cluster with FPGAs and GPUs"; FPGA'10, Feb. 2010.

Kim, J. et al.: "Implementation of an SDR system Using Graphics Processing Unit"; IEEE Communications Magazine; Mar. 2010.

Denic, S.; Search Report from related PCT Application No. PCT/CA2012/000314; search completed Aug. 15, 2012.

Khader, T.; Search Report from corresponding PCT Application No. PCT/CA2012/050608; search completed Jan. 14, 2013.

Peeters, Mark; Supplementary European search report from corresponding European Application No. 12829337.0; search completed Apr. 9, 2015.

\* cited by examiner

SYSTEMS AND METHODS FOR PERFORMING DEMODULATION AND MODULATION ON SOFTWARE DEFINED RADIOS

CROSS-REFERENCE TO RELATED APPLICATIONS

This application is a continuation of PCT Application No. PCT/CA2012/050608 filed on Sep. 4, 2012, which claims priority from U.S. Provisional Patent Application Ser. No. 61/532,685 filed on Sep. 9, 2011 and from PCT Application No. PCT/CA2012/000314 filed on Mar. 26, 2012, the entire contents of all of which are incorporated herein by reference.

TECHNICAL FIELD

The present invention relates to radio communication systems, and in particular to software defined radio systems.

BACKGROUND OF INVENTION

Traditionally, development of radio communication products involves significant hardware development effort. Software defined radio (SDR) is a technology that implements physical layer wireless communication technologies in software, turning many radio-related hardware development problems into software issues. This can shorten the product development cycle, reduce costs, and make product distribution much easier. Moreover, SDR provides increased flexibility and programmability, which can speed up innovation in wireless communications.

SDR platforms have been developed using a personal computer's central processing unit (CPU), working in connection with a field programmable gate array (FPGA), with some radio frequency (RF) front end hardware to receive and transmit radio waveforms. Some SDR applications require complex modulation or computationally intensive algorithms that may include Fast Fourier Transforms (FFTs), cross-correlation, or the calculation of mutual information metrics. These operations can be costly in terms of processing power. A CPU working in connection with an FPGA may lack the computing architecture to support these applications. More recently, SDR platforms have been developed using a CPU working in connection with a graphics processing unit (GPU). However, a GPU working in connection with a CPU may lack the streaming or serial processing capabilities to fulfill the real-time requirements of digital communication algorithms that perform serial processing.

It is an object of the present invention to obviate or mitigate one or more of the above disadvantages.

SUMMARY OF THE INVENTION

In one aspect, there is provided a method of extracting and demodulating one or more channels in a radio signal. The method includes receiving a first radio signal using a radio frequency front end, translating a first band of frequencies of the first radio signal to a second band of frequencies to generate a second radio signal, digitizing the second radio signal to generate a digital signal and extracting one or more additional band of frequencies of the digital signal, each additional band of frequencies corresponding to a channel, and demodulating one or more channels to generate a respective demodulated signal.

In another aspect, there is provided a method of modulating and combining one or more channels into a radio signal. The method includes receiving one or more digital input signals, modulating one or more digital input signals to generate a respective modulated signal, translating a first band of frequencies of one or more modulated signals to a second band of frequencies corresponding to a channel, combining one or more channels to generate a combined signal, converting the combined signal to an analog signal, translating a third band of frequencies of the analog signal to a transmitting band of frequencies to generate a radio signal and transmitting the radio signal using a radio frequency front end.

In another aspect, an electronic device, such as an SDR device, is provided. The electronic device includes a RF front end, a processing unit and memory. The memory stores computer executable instructions that when executed by the processing unit, causes the electronic device to receive a first radio signal using the RF front end, translate a first band of frequencies of the first radio signal to a second band of frequencies to generate a second radio signal, digitize the second radio signal to generate a digital signal and extract one or more additional band of frequencies of the digital signal, each additional band of frequencies corresponding to a channel and demodulate one or more channels to generate a respective demodulated signal.

In another aspect, another electronic device, such as an SDR device, is provided. The electronic device includes a RF front end, a processing unit and memory. The memory stores computer executable instructions that when executed by the processing unit, causes the electronic device to receive one or more digital input signals, modulate one or more digital input signals to generate a respective modulated signal, translate a first band of frequencies of one or more modulated signals to a second band of frequencies corresponding to a channel, combine one or more channels to generate a combined signal, convert the combined signal to an analog signal, translate a third band of frequencies of the analog signal to a transmitting band of frequencies to generate a radio signal and transmit the radio signal using the RF front end.

In another aspect, a computer readable storage medium is provided for extracting and demodulating one or more channels in a radio signal. The computer readable storage medium includes computer executable instructions that when executed by a processing unit, causes the processing unit to receive a first radio signal using the RF front end, translate a first band of frequencies of the first radio signal to a second band of frequencies to generate a second radio signal, digitize the second radio signal to generate a digital signal and extract one or more additional band of frequencies of the digital signal, each additional band of frequencies corresponding to a channel and demodulate one or more channels to generate a respective demodulated signal.

In another aspect, a computer readable storage medium is provided for modulating and combining one or more channels into a radio signal. The computer readable storage medium includes computer executable instructions that when executed by a processing unit, causes the processing unit to receive one or more digital input signals, modulate one or more digital input signals to generate a respective modulated signal, translate a first band of frequencies of one or more modulated signals to a second band of frequencies corresponding to a channel, combine one or more channels to generate a combined signal, convert the combined signal to an analog signal, translate a third band of frequencies of the analog signal to a transmitting band of frequencies to generate a radio signal and transmit the radio signal using the RF front end.

In another aspect, there is provided a SDR device comprising a RF front end, a FPGA in communication with the RF front end and a GPU in communication with the FPGA. The RF front end is operable to receive and transmit one or more radio signals. The FPGA is operable to perform serial processing on one or more digital signals corresponding to the one or more radio signals. The GPU is operable to perform parallel processing on the one or more digital signals. The SDR device can also include a CPU in communication with at least one of the FPGA and GPU for performing general computations such as providing a user interface and programming the FPGA and/or GPU.

BRIEF DESCRIPTION OF THE DRAWINGS

Embodiments of the invention will be described by way of example only with reference to the accompanying drawings in which.

DETAILED DESCRIPTION OF THE INVENTION

Figure 1:
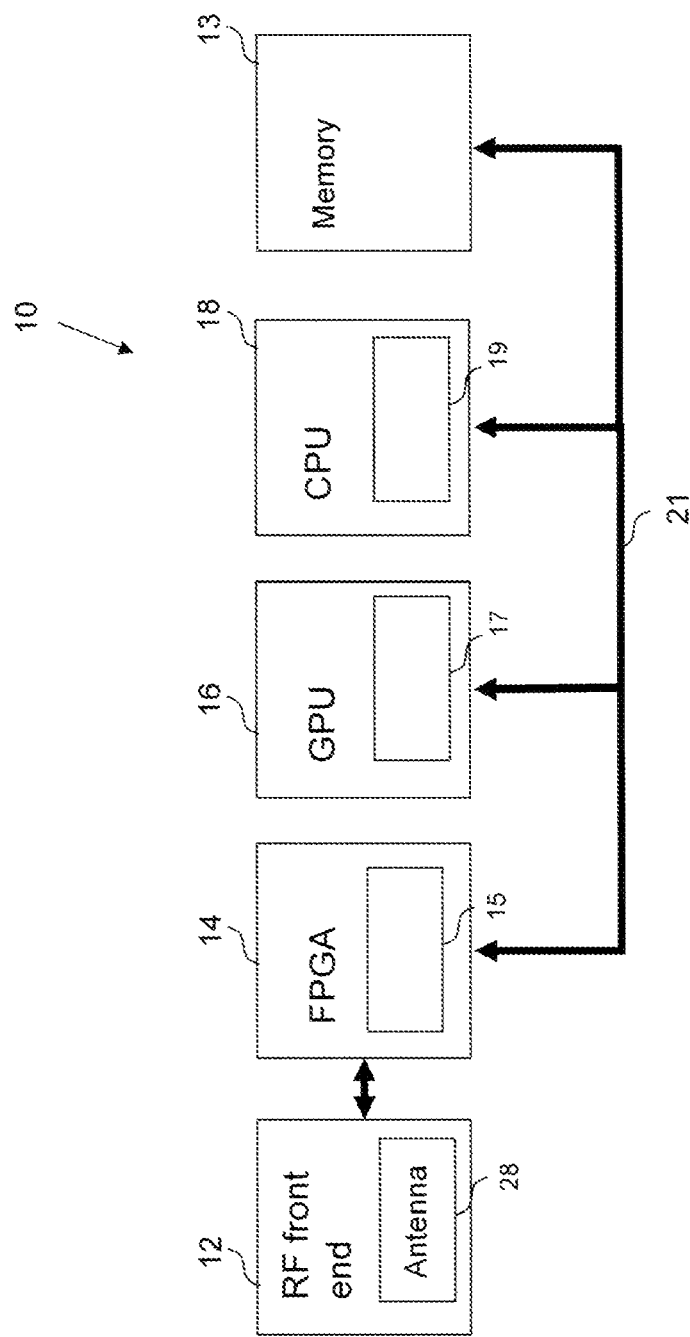
FIG. 1 is a block diagram of an example SDR device.

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practised without these specific details. In other instances, well-known methods, procedures and components have not been described in detail so as not to obscure the example embodiments described herein. Also, the description is not to be considered as limiting the scope of the example embodiments described herein.

Turning to FIG. 1, a schematic diagram of an example SDR device 10 is provided. In this example, the SDR device 10 includes a RF front end 12 having an antenna 28 for receiving and converting electromagnetic radiation into a digital signal, a field programmable gate array (FPGA) 14 for performing high speed serial processing and a graphics processing unit (GPU) 16 for performing parallel processing. The SDR device 10 may also include a general purpose computer processing unit (CPU) 18 for performing general computations including providing the user interface and programming the FPGA 14 and GPU 16. The FPGA 14, GPU 16 and CPU 18 can each have its own memory 15, 17 and 19, respectively and/or can access a separate memory component 13 of the device 10. It is understood that the FPGA 14 can include any suitable programmable logic device and GPU 16 includes general purpose computing on graphics processing unit ((GP)GPU).

In the example of FIG. 1, the RF front end 12 is connected to the FPGA 14 and is operable to communicate with the FPGA 14 by a plurality of digital signals. The FPGA 14, GPU 16 and CPU 18 are connected to one another by a high speed bus 21, such as a Peripheral Component Interconnect Express (PCIe) bus, for example.

The SDR device 10 enables rapid serial and parallel computation of signal processing data. For example, the SDR device 10 can divide signal processing algorithms into block and streaming processes and implement the block and stream processes to optimize processing efficiency. Stream processing may segment the input signal into a plurality of discrete segments or "chunks" based, in part, on the current state of the input signal passing through it, while block processing may comprise fixed, invariant, processing on each chunk.

In one example SDR device 10, the FPGA 14 provides a fast serial processing environment to perform stream processing. The GPU 16 provides a parallel processing environment to parallelize block processes. The GPU 16, thus effectively implements parallelizable calculations and algorithms, including, for example, weak signal reconstruction, auto-correlation, FFTs, mutual information metrics, as well as concurrent processing of arbitrary algorithms or calculations on single or multiple data streams.

The programmability of the FPGA 14 and the GPU 16 also provides flexibility, such that the SDR device 10 may be capable of running arbitrary wireless protocols. For example, FPGA 14 and GPU 16 can be reprogrammed by CPU 18 during operation to handle changes in the communication protocol on an input signal. Once programmed, the SDR device 10 can autonomously store and send data without requiring additional configuration or intervention.

The SDR device 10 can also be configured to concurrently monitor spectral and network resources and adjust transmission and receiving parameters accordingly. Furthermore, the SDR device 10 can manage its own resources (e.g. FPGA 14 and GPU 16) such that tasks are efficiently allocated to the appropriate component based on the type of computation and resource usage.

In an example application of the SDR device 10, it is operable to identify and intercept a radio signal comprising one or more radio frequency bands, extract one or more channels from the radio signal, the radio signal having a bandwidth at least as wide as each channel, and process one or more channels in parallel. Preferably, the SDR device 10 is applied to a radio signal comprising a plurality of radio frequency bands.

Figure 2:
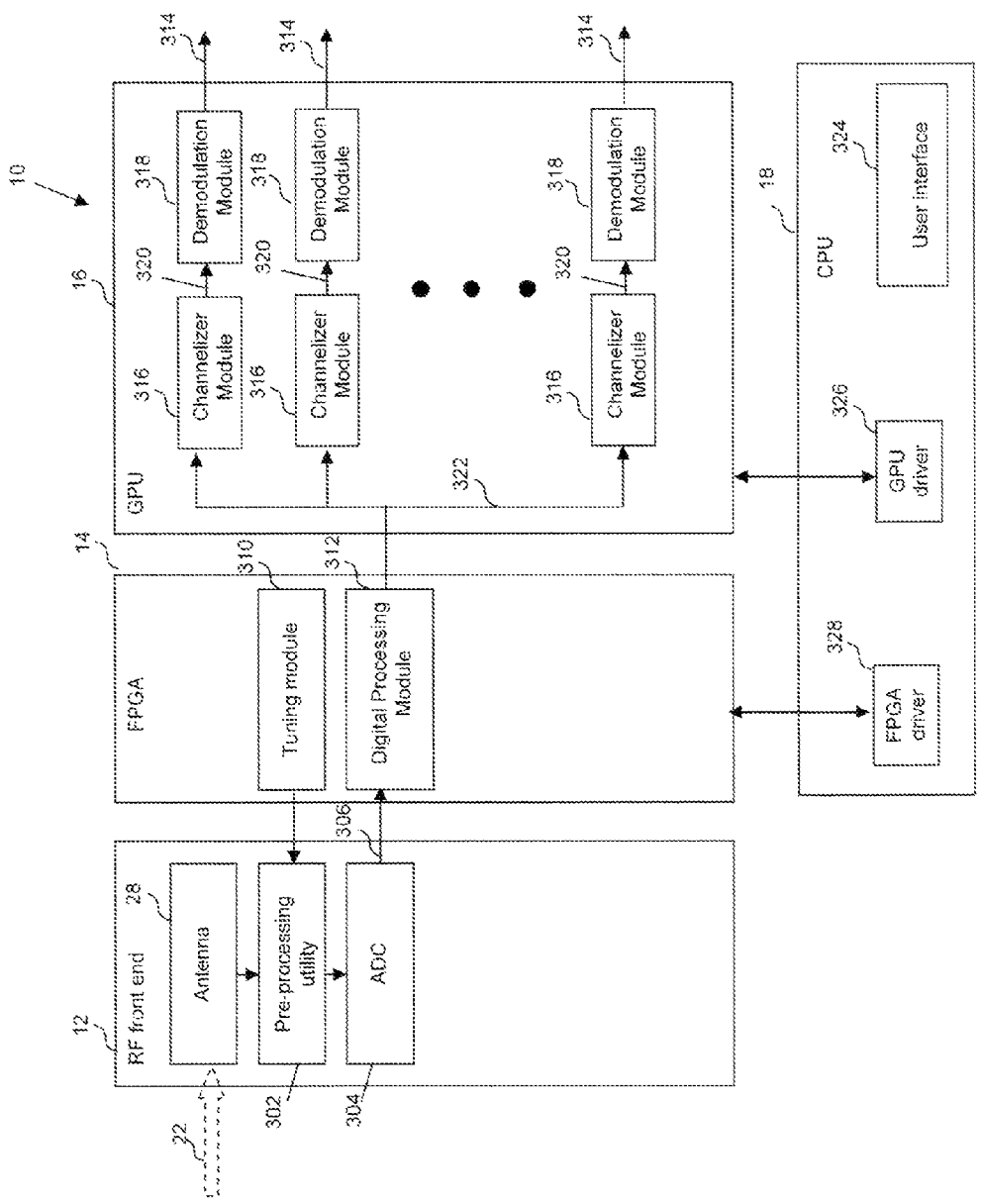
FIG. 2 is a block diagram of an example configuration of a SDR device for the specific application of extracting and demodulating channels in a radio signal.

Referring to FIG. 2, a block diagram of an example configuration of the SDR device 10 for the specific application of extracting and demodulating a plurality of channels in a radio signal is provided. The SDR device 10 has an RF front end 12 which includes an antenna 28 to receive a radio signal 22, a pre-processing utility 302 to isolate a band of frequencies in the radio signal 22 and to process the radio signal 22 for digitization, and an analog to digital converter (ADC) 304 to convert the pre-processed radio signal 22 into a digital signal 306. A tuning module 310 of the FPGA 14 may determine and provide a centre frequency and filter parameters to configure the pre-processing utility 302 to isolate a band of frequencies centred around the centre frequency and having a width based on the filtering parameters. The digital signal 306 produced by the ADC 304 is sent to the FPGA 14.

Figure 3:
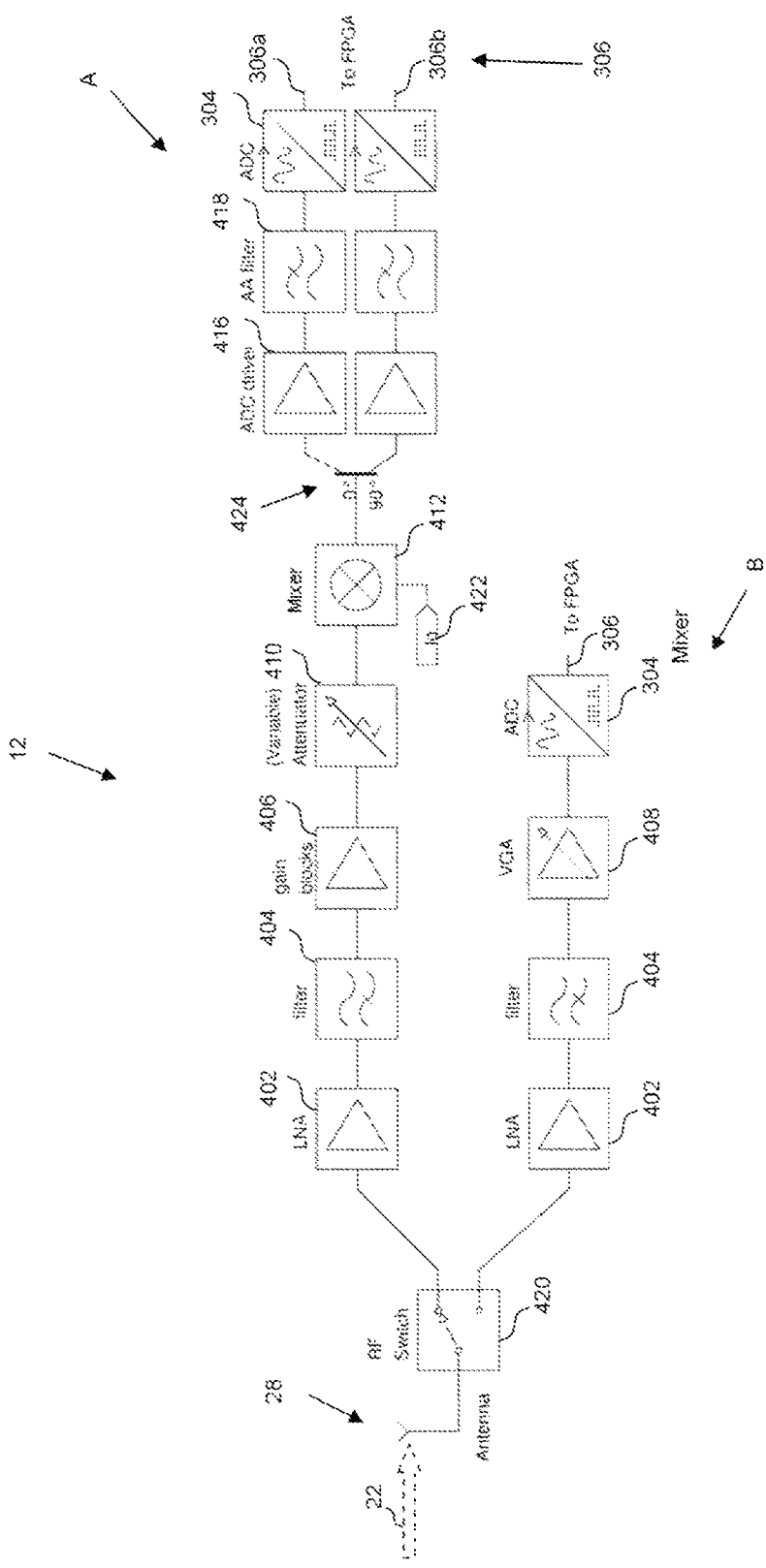
FIG. 3 is a schematic diagram of an example RF front end.

Turning to FIG. 3, a more detailed schematic diagram of an example RF front end 12 is provided. The RF front end pre-processes the radio signal 22 by amplification and down-conversion prior to digitization. The RF front end includes an antenna 28 to intercept the radio signal 22 and may include pre-processing components such as a low noise amplifier (LNA) 402 to amplify weak signals, a high pass filter (HPF) 404 to filter and pass high frequencies and attenuate low frequencies, an amplifier (e.g. gain block 406 and/or variable gain amplifier 408), a variable attenuator 410 to vary the signal gain, a down-converter 412 to down-convert the signal to baseband, an analog to digital converter (ADC) 304, and a driver 416 and anti-aliasing filter 418 to improve the quality of the ADC conversion.

In the example of FIG. 3, the RF front end 12 has two modes of operation A and B, selectable by a switch 420. Each mode of operation performs a series of operations on the radio signal 22 before digitization by the ADC 304. In FIG. 3, the first mode of operation A is selected. The radio signal 22 intercepted by the antenna 28 is amplified by the LNA 402 and filtered using the HPF 404. The gain of the radio signal 22 is then modified using gain block 406 and variable attenuator 410. The resulting signal is then down-converted by first mixing in a signal generated by the local oscillator 422 using mixer 412. The local oscillator 422 is configured to generate a signal at the centre frequency provided by the tuning module 310 of the FPGA 14. The mixed signal can be phase shifted by phase converter 424, further amplified by driver 416 and filtered by anti-aliasing filter 418 to produce a baseband signal prior to digitization using the ADC 304. In this example, the resulting digital signal 306 is decomposed into its quadrature-carrier (IQ) form made of the in-phase component 306a, and the quadrature component 306b. The cut off frequency of the baseband signal can be determined by the anti-aliasing filters 418 and can be configured based on the application of the SDR device 10.

By modifying the centre frequency and filter parameters, the SDR device 10 can tune into and isolate a specific band of frequencies in the radio signal 22. It can be appreciated that the RF front end 12 can be any appropriate receiver capable of isolating the frequency band of interest and digitizing the radio signal 22.

In the second mode of operation B of the example RF front end 12 of FIG. 3, the analog signal received by the antenna 28 can be amplified by LNA 402 and filtered using HPF 404, as in first mode of operation A. However, the analog signal can then be amplified using variable gain amplifier 408 and directly applied to ADC 304.

Turning back to FIG. 2, the SDR device 10 in this example also has an FPGA 14 configured to include a tuning module 310 for providing the pre-processing stage 302 of the RF front end 12 with a centre frequency and filtering parameters and a digital processing module 312 for digitally processing the digital signal 306. In one embodiment, the digital processing module 312 implements a digital up/down converter on the FPGA 14 to isolate a band of frequencies within the digital signal 306. Further up or down conversion carried out by the digital processing module 312 can correct or reduce an error in the analog down conversion carried out by the RF front end 12. In another embodiment, the digital processing module 312 carries out filtering and/or decimation on the digital signal 306 to reduce the bandwidth of the digital signal 306 (for example, to satisfy the bandwidth limit of the high speed bus 21 connecting the FPGA 14 to the GPU 16). This allows the FPGA 14 to negotiate data transfers over the bus 21. The digital processing module 312 can implement a digital low pass filter to reduce the width of the frequency band of the digital signal 306 and/or implement a digital downsampler to decimate the digital signal 306.

In the example of an RF front end 12 operating in mode B, the digital processing module 312 can operate as the primary module for extracting the desired band of frequencies from the radio signal 22. In one embodiment, the digital processing module 312 can implement multiple instances of digital up/down converters and filters to isolate more than one band of frequencies from the digital signal 306.

It can further be appreciated that the FPGA 14 can route the digital signal 306 to one or more of its modules, its internal memory, and/or bypass the FPGA processing all together, by configuring the programmable switches provided by the FPGA. For example, certain data may not require further down-conversion of the digital signal 306. The selection and passage of the any signal within FPGA 14 can be set according to the desired application using appropriately configured switches.

The SDR device 10 in the example also has a GPU 16 configured to include a plurality of channelizer modules 316 for extracting a channel 320 from the processed digital signal 322 and a plurality of demodulation modules 318 to carry out demodulation of a channel 320 to produce a demodulated signal 314.

Each channelizer module 316 can separate a specific frequency sub-band (i.e. channel 320) from the processed digital signal 322 containing a band of frequencies. In one example embodiment, the channelizer module 316 is a digital up/down converter implemented on the GPU 16. The channelizer module 316 down converts or up converts the desired sub band to baseband depending on whether the desired band contains positive or negative frequencies. The down or up conversion of frequency can be followed by filtering using a low pass filter to determine the frequency width of the channel and subsequently decimated using a downsampler.

A channelizer modules 316 can operate in parallel with one or more other channelizer modules 316 to extract multiple channels 320 from the processed digital signal 322 and provide the channels 320 to a plurality of demodulation modules 318 for further processing. In the example of FIG. 2, each channelizer module 316 provides the extracted channel 320 to a respective demodulation module 318. The demodulation modules 318 can operate on its respective channel 320 in parallel with the operation of other demodulation modules 318 to produce its respective demodulated signal 314. The demodulated signals 314 can be further processed based on the desired application. For example, a demodulated signal 314 can be combined with one or more other demodulated signals 314, stored in memory, further processed by the CPU, or independently viewed by the user on a computer.

It can be appreciated that the GPU 16 can have one or more demodulation modules 318 to carry out one or more different demodulation techniques on the FPGA output 322, such as demodulation of a radio signal modulated using amplitude modulation (AM), frequency modulation (FM) and single-sideband modulation (SSB). Each demodulation module 318 can also apply demodulation to one or more different communication protocols (for example Global System for Mobile Communications (GSM) or Zigbee). The modulation techniques and communication protocols can be configured by the user or provided by third parties. Furthermore, the demodulation modules 318 can be reprogrammed during operation to implement a different modulation technique and/or communication protocol. Accordingly, the demodulation module 318 allows for different modulation techniques and communication protocols to be determined and implemented dynamically (on the fly) while the device remains operational.

Figure 4:
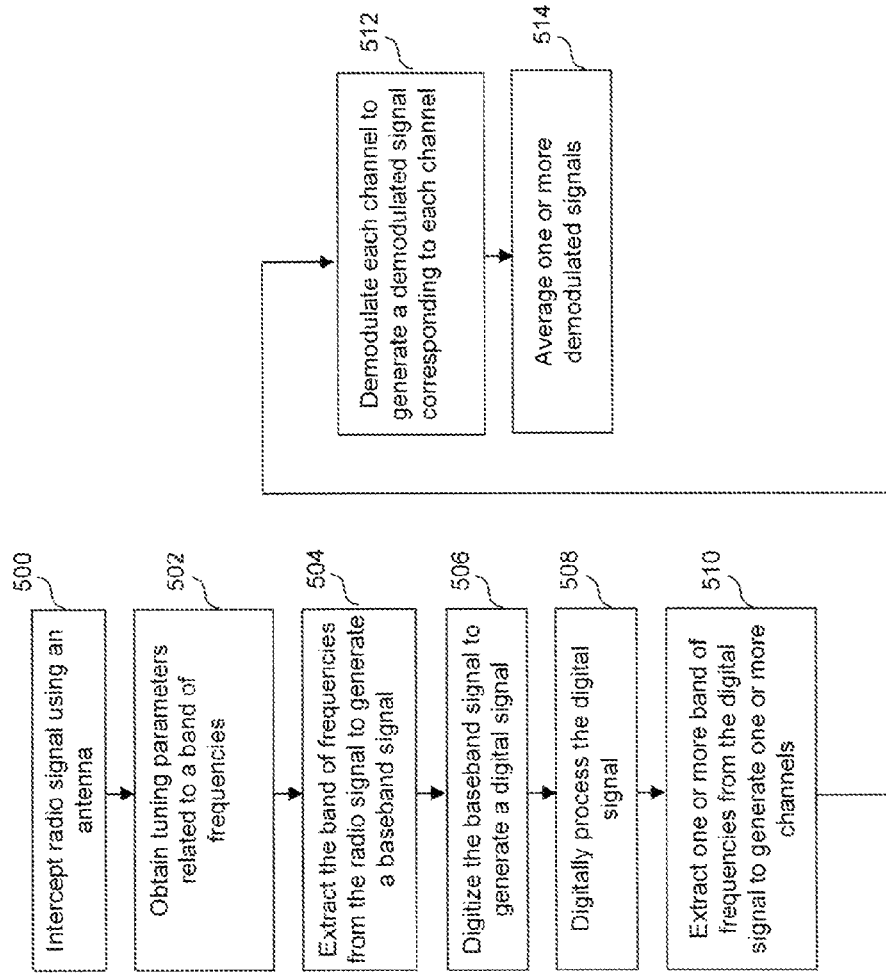
FIG. 4 is a flow chart of an example process of extracting and demodulating channels in a radio signal using an example SDR device.

Turning to FIG. 4, a flow chart of an example process for extracting and demodulating one or more channels in a radio signal 22 is provided. At block 500, RF front end 12 intercepts an radio signal 22 using its antenna 28. At block 502, the device 10 obtains tuning parameters related to a band of frequencies that are to be extracted from the radio signal 22, such as the centre frequency and filter parameters. At block 504, RF front end 12 extracts a band of frequencies from the radio signal 22 to generate a baseband signal. At block 506, RF front end 12 digitizes the baseband signal using its ADC 304 to generate a digital signal 306. At block 508, FPGA 14 digitally processes the digital signal 306, for example, by further down or up converting the digital signal to compensate for errors introduced in the extraction of a band of frequencies from the radio signal 22. At block 510, GPU 16 extracts one or more band of frequencies from the digital signal 306 to generate one or more channels using the channelizer modules 316. At block 512, GPU 16 demodulates each channel 320 using its demodulation module 318 to generate a demodulated signal 314.

As noted above, at block 508, FPGA 14 can digitally process the digital signal 306 containing a band of frequencies using the digital processing module 312. In one embodiment, the FPGA 14 can improve or correct errors introduced during extraction of the desired band of frequencies by the RF front end 12 by configuring the digital processing module to implement a suitable digital up or down converter to translate the frequency band of the digital signal 306. In another embodiment, the digital processing module can be configured to implement a suitable digital low pass filter and downsampler to filter and decimate the digital signal 306 in order to reduce its bandwidth.

As noted above, at block 510, GPU 16 extracts one or more band of frequencies from the digital signal 306 to generate one or more channels. At block 512, each channel is demodulated to generate a corresponding demodulated signal 314. In the example SDR device of FIG. 3, the GPU 16 includes multiple channelizer modules 316, each having a respective demodulation module 318. The channelizer modules 316 and demodulation modules 318 can operate in parallel so that multiple channels are extracted and demodulated simultaneously, thus taking advantage of the parallel processing capabilities of the GPU 16.

In one embodiment, each channelizer module 316 extracts a different band of frequencies from the digital signal 306 to be demodulated by the same or different demodulation schemes in the demodulation modules 318. In another embodiment, more than one channelizer module 316 can extract the same band of frequencies but have different demodulation performed by its respective demodulation module 318. For example, the radio signal 22 received by the SDR device 10 can include multiple signals broadcast on the same or similar frequencies but having different timing characteristics. The SDR device 10 can provide concurrent processing of the same frequency on different channels to accommodate multiple but similar broadcasting sources.

In an example, the process of extracting and demodulating one or more channels in a radio signal can also include averaging the demodulated signal 314, as shown at block 514. In one embodiment, the demodulating module 318 of the example SDR device 10 can perform time domain averaging on a segment of the demodulated signal 314 with one or more previous segments of the same demodulated signal 314 to improve the quality of the demodulated signal 314.

In another embodiment, the demodulating module 318 can average a demodulated signal 314 of one channel 320 with one or more demodulated signals 314 of another channel 320. For example, if the band of frequencies in the digital signal 306 correspond to the frequency components of a common signal, the channels extracted by the SDR device would correspond to the frequency components of the common signal. In this embodiment, the demodulating module 318 can also average a plurality demodulated signals 314 of different channels 320 to provide frequency domain averaging of multiple samples (at a given point in time) to improve signal quality and reduce measurement errors. In another embodiment, different demodulated signals 314 can be compared, cross-correlated, or otherwise analyzed for similarities, statistical metrics, etc. to improve the quality of a demodulated signal 314.

An example application of the SDR device 10 is a FM radio receiver capable of concurrently tuning into, and recording multiple channels (corresponding to an FM radio station) in the FM radio band. FM radio currently broadcasts using frequencies between 88.0 and 108.0 MHz, each channel being 200 kHz wide and centered about 0.1, 0.3, 0.5, 0.7, or 0.9 MHz. In this example embodiment, the SDR device 10 can be configured to have a centre frequency of 88 MHz and filtering parameters such that the cut off frequency of the baseband signal is 20 MHz. The RF front end 12 can extract and down convert the band of frequencies from 88.0 to 108.0 MHz in the radio signal 22 to a baseband signal from 0 Hz to 20 MHz using the pre-processing utility 302 of the RF front end 12. This allows the baseband signal to contain the information of the entire FM radio band.

The RF front end 12 can then digitize the baseband signal using its ADC 304 to generate a digital signal 306 which is then passed to the FPGA 14 for digital processing such as filtering, decimation, IQ demodulation, etc. In the example of the FM radio receiver, each channelizer module 316 of the GPU 16 can shift and decimate the digital signal 306 to extract a band of frequencies of width 200 kHz centered about 0.1, 0.3, 0.5, 0.7, or 0.9 MHz, corresponding to the information broadcasted by a FM radio station. In this example, the demodulation modules 318 can be configured to perform FM demodulation to recover the information in the FM radio broadcast such as audio data, pilot tones, etc.

Although the SDR device 10 has been described for extracting and demodulating a plurality of channels from a radio signal, it can be appreciated that the SDR device 10 can be modified to be operable to modulate one or more signals across one or more frequencies and to combine the modulated signals into a common signal for transmission. For example, complementary components and modules can be used to replace those described in FIGS. 2 and 3 of the example SDR device 10. Similarly, complementary operations can be used to replace those described in the example process of FIG. 4.

Figure 5:
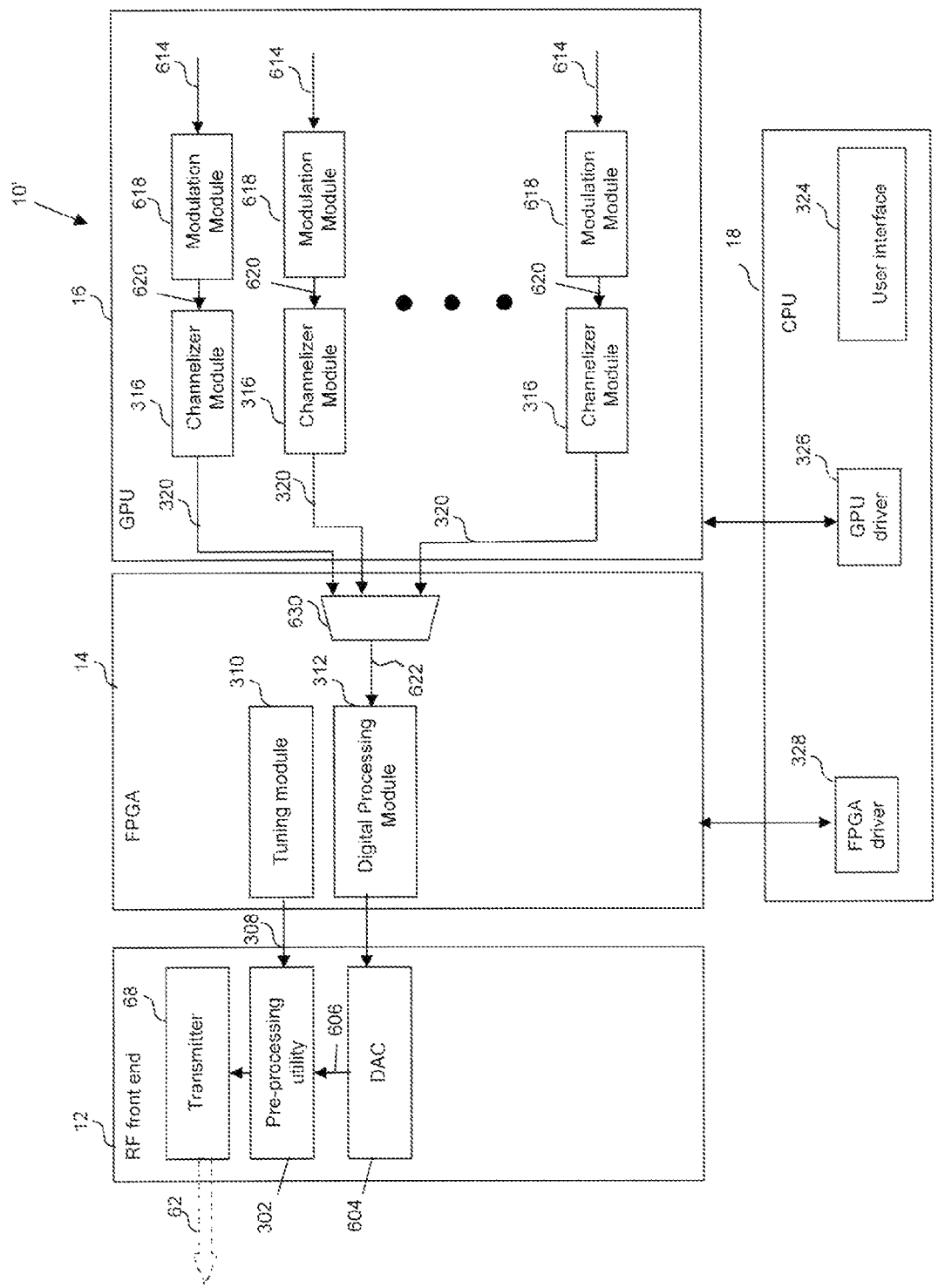
FIG. 5 is a block diagram of an example configuration of a SDR device for the specific application of modulating and combining a plurality of channels.

Referring to FIG. 5, a block diagram of an example configuration of the SDR device 10' for the specific application of modulating and combining a plurality of channels is provided. The SDR device 10' in the example has a GPU 16 configured to include a plurality of modulation modules 618 to carry out modulation of an input signal 614 to produce a respective modulated signal 620 and a plurality of channelizer modules 316 for translating a modulated signal 620 to a specific band of frequencies to generate a channel 320.

Similar to the example SDR device 10, each modulation module 618 can operate on its respective input signal 614 in parallel with the operation of other modulation modules 618 to produce its respective modulated signal 620. In the example of FIG. 5, each modulation module 618 provides its modulated signal 620 to a respective channelizer module 316.

It can be appreciated that the GPU 16 can have one or more modulation modules 618 to carry out one or more different modulation techniques, such as amplitude modulation (AM), frequency modulation (FM) and single-sideband modulation (SSB). Each modulation module 618 can also apply modulation to one or more different communication protocols (for example GSM or Zigbee). The modulation techniques and communication protocols can be configured by the user or provided by third parties. Furthermore, the modulation modules 618 can be reprogrammed during operation to implement a different modulation technique and/or communication protocol. Accordingly, the modulation module 618 allows for different modulation techniques and communication protocols to be determined and implemented dynamically (on the fly) while the device remains operational.

Each channelizer module 316 can translate a modulated signal 620 to specific frequency sub band (i.e. channel 320) of a band of frequencies that will make up the combined signal 622. In one example embodiment, the channelizer module 316 is a digital up/down converter implemented on the GPU 16. The channelizer module 316 down converts or up converts the modulated signal 620 depending on the desired sub band (i.e. channel 320) desired to contain the modulated signal 620. It can be appreciated that one or more modulation modules 618 and channelizer modules 316 can operate in parallel on the GPU 16.

The SDR device 10' in this example also has an FPGA 14 configured to include a multiplexer 630 to combine one or more channels 320 provided by the GPU 16 to generate a combined signal 622, a digital processing module 312 for digitally processing the combined signal 622 in preparation of digital to analog conversion, and a tuning module 310 for providing transmission parameters (such as centre frequency and filtering parameters) to the RF front end 12.

As noted above, a multiplexer 630 implemented on the FPGA 14 is used in the example SDR device 10' to combine one or more channels 320. It can be appreciated that the multiplexer 630 can be implemented on the GPU 16 or that a combination of multiplexers 630 may be used implemented on both the FPGA 14 and GPU 16.

In one embodiment, multiple digital processing modules 312 may be implemented on the FPGA 14, each digital processing module 312 receiving a subset of all channels 320. The digitally processed signals of each digital processing module 312 can then be combined by one or more multiplexers in the RF front end 12. This allows the SDR device 10' to group similar frequency channels together for processing and optimizing processing for that particular band of frequencies.

In one embodiment, the digital processing module 312 implements a digital up and/or down converter. The digital processing module 312 can also be configured to perform filtering on the combined signal 622 prior to digital to analog conversion. Examples of such filters include linear filters to reduce spurious emissions and nonlinear filters which can compensate for nonlinearities in the RF front end 12.

The example SDR device 10' also has an RF front end 12 which includes a digital to analog converter (DAC) 604 to convert the digitally processed combined signal 622 into an analog signal 606, a pre-processing utility 302 to translate the frequency band of the analog signal 606 to the desired band of frequencies for transmission, and a transmitter (e.g. antenna) for transmitting the analog output signal 62. A tuning module 310 of the FPGA 14 may determine and provide a centre frequency and filter parameters to configure the pre-processing utility 302 to translate the analog signal 606 to a band of frequencies centred around the centre frequency and having a width of frequencies based on the filtering parameters. The analog signal 606 is processed by the pre-processing utility 302 using the centre frequency and filtering parameters and then sent to the transmitter 68 for transmission.

Figure 6:
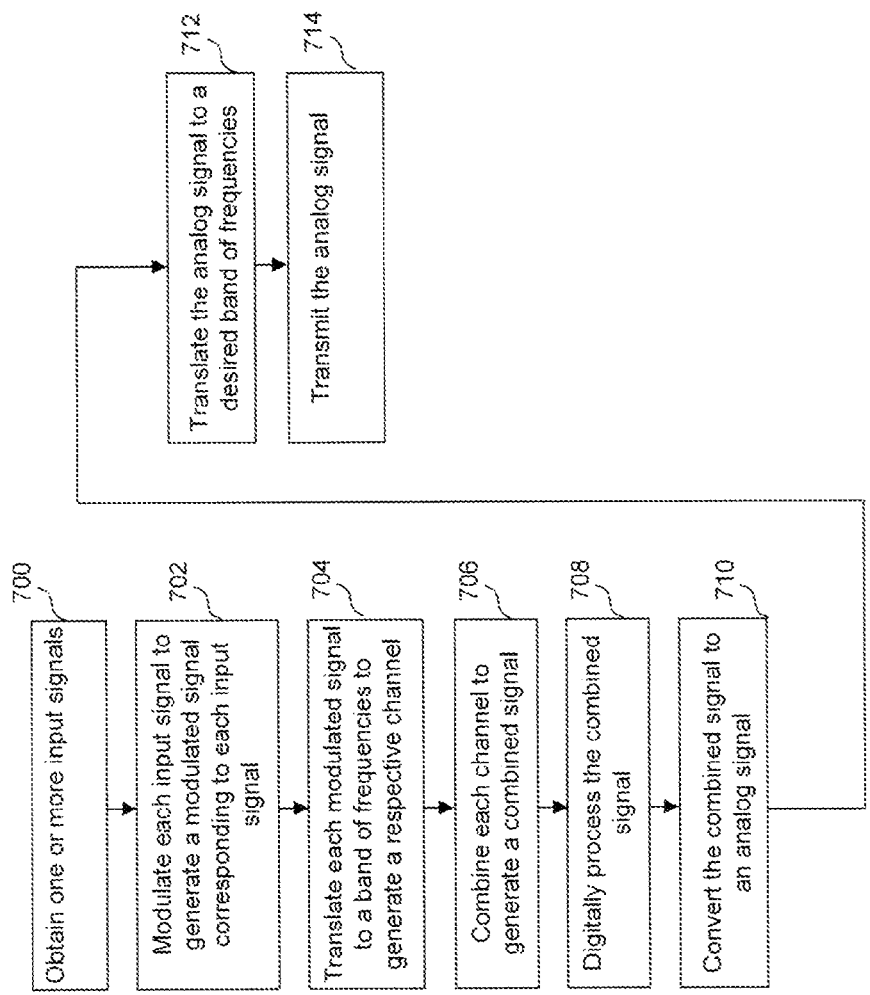
FIG. 6 is a flow chart of an example process of modulating and combining a plurality of channels using an example SDR device.

Turning to FIG. 6, a flow chart of an example process for modulating and combining one or more channels is provided. At block 700, one or more input signals 614 are obtained by the GPU 16. In one embodiment, the input signals 614 can be provided by the FPGA 14 or CPU 18. In another embodiment, an input signal 614 can be provided from the demodulated signal 314 of the example SDR device 10.

At block 702, input signals 614 are modulated to generate a respective modulated signal 620. In the example SDR device 10' of FIG. 5, the modulation modules 318 of the GPU 16 modulate the input signals 614. In one embodiment, a plurality of modulation modules 318 operate in parallel to modulate multiple input signals 614 concurrently.

At block 704, each modulated signal 620 is translated to a band of frequencies to generate a respective channel 320. In the example SDR device 10' of FIG. 5, the channelizer modules 318 translate the modulated signals 620 to a band of frequencies. In an embodiment, each modulated signal 620 is translated to a different band of frequencies. In another embodiment, more than one modulated signal 620 can be translated to the same frequency. A plurality of channelizer modules 316 can operate in parallel.

At block 706, each channel 320 is combined to generate a combined signal 622. In the example SDR device 10' of FIG. 5, a multiplexer 630 implemented on the FPGA 14 combines each channel 316 into the combined signal 622.

At block 708, the combined signal 622 is digitally processed. In one embodiment, the combined signal 622 is prepared for improved digital to analog conversion. In the example SDR device 10' of FIG. 5, the digital processing module 312 of the FPGA 14 digitally processes the combined signal 622.

At block 710, the digital combined signal 622 is converted to an analog signal 606. In the example SDR device 10' of FIG. 5, the DAC 604 of the RF front end 12 performs the conversion.

At block 712, the analog signal 606 is translated to the desired band of frequencies. In the example SDR device 10' of FIG. 5, the pre-processing utility 302 of the RF front end 12 performs the translation, using a centre frequency and filtering parameters provided by the tuning module 310 of the FPGA 14.

At block 714, the analog signal 606 is transmitted. In the example SDR device 10' of FIG. 5, the transmitter 68 (e.g. an antenna) of the RF front end transmits the analog signal 606.

An example application of the SDR device 10' of FIG. 5 is to transmit audio data on multiple FM radio channels concurrently. For example, provided a song collection categorized into different genres, audio data of each genre can serve as an input signal 614 to a modulation module 618 for frequency modulating the audio data of each genre on to a different channel. The multiplexer 630 combines each channel into the combined signal 622 which is then be translated to a frequency band within the FM radio frequency band (i.e. 88.0 and 108.0 MHz) by the pre-processing utility 302 of the RF front end 12. The output signal 62 transmitted by the SDR device 10' contains audio data of each genre on separate FM radio channels that can be received by other FM radio devices.

In another example application, if each input signal 614 corresponds to one frequency component of a signal, the SDR device 11 can combine the frequency components into the combined signal 622 to more accurately replicate the original signal because the combined signal 622 contains more frequency components than an individual input signal 614.

As noted above, in one embodiment, the input signal 614 of the example SDR device 10' can correspond to the demodulated signal 314 of the example SDR device 10. It can be appreciated that the SDR devices 10 and 10' can be implemented on a common RF front end 12, FPGA 14, GPU 16 and CPU 18 to create one SDR device capable of performing the functionality of both SDR devices 10 and 10'. It can also be appreciated that modules implemented on a component of SDR devices 10 and 10' may be combined.

In one embodiment, a SDR device can intercept a radio signal 22 having multiple channels 320 of information and demodulate each channel 320 according to a particular communication and demodulation protocol using the example process of FIG. 5. The same SDR device can then modulate and transmit each demodulated signal 314 according to a different communication and/or modulation protocol that does not correspond to the communication and/or modulation protocol of the channels in the radio signal 22 using the example process of FIG. 7. Example communication and modulation protocols that can be used include AM, SSB, Quadrature Amplitude modulation (QAM), GSM, Code Division Multiple Access (CDMA), Global Packet Radio Service (GPRS), etc.

In this embodiment, the SDR device can translate information between different frequencies, modulation/demodulation protocols and/or communication protocols to allow communication between devices using different frequencies, modulation/demodulation protocols and/or communication protocols.

For example, the SDR device can receive the radio signal 22 containing information transmitted by a mobile device under a cellular communication protocol such as GSM or CDMA and rebroadcast the information over a different wireless network such as Wifi. In another embodiment, the radio signal can be translated and transmitted through a wired connection to a local area network (LAN).

Turning back to FIGS. 2 and 5, the SDR devices 10 and 10' can also include a CPU 18 configured to provide a user interface 324 for allowing a user to interact with the SDR device 10. The CPU 18 includes a GPU driver 326 and a FPGA driver 328. The drivers 326 and 328 enable the CPU 18 to communicate with the FPGA 14 and GPU 16 (for example, to program the FPGA 14 and GPU 16).

Figure 7:
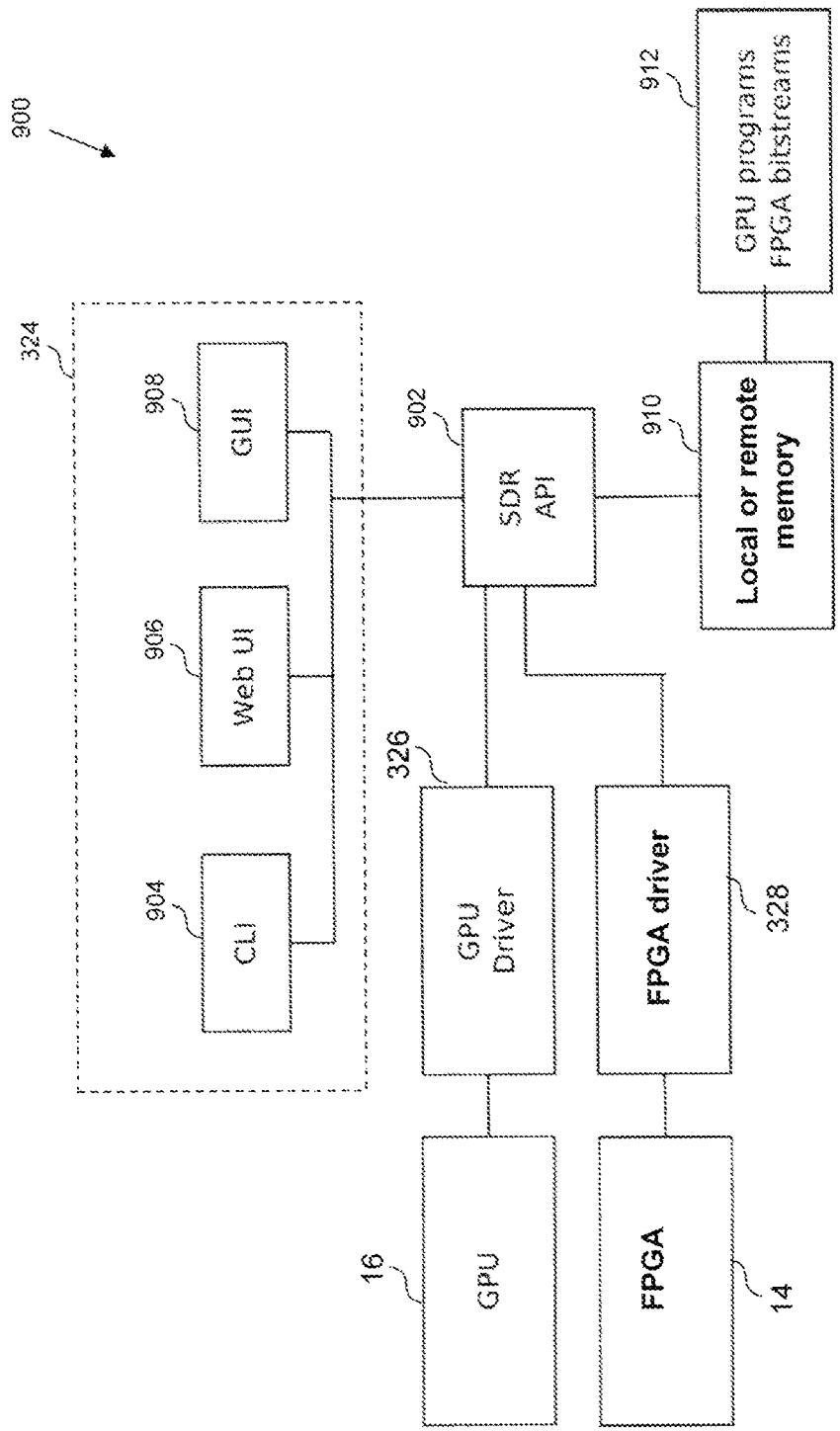
FIG. 7 is a block diagram of an example application layer of the SDR device.

Turning to FIG. 7, a block diagram of a example application layer 900 of the SDR device 10 is shown. In this example, the application layer 900 includes a SDR API 902 that provides the rules and specifications to access the components of the device 10, such as GPU 16 and FPGA 14. Each component also has its own driver to interface with the SDR API 902 (e.g. GPU driver 326, FPGA driver 328). Accordingly, a user can access the device 10 using the user interface 324, which can include a command line interface (CLI) 904, web user interface (Web UI) 906 and/or graphical user interface (GUI) 908, enabling communication with the device resources through the API 902. In the example of FIG. 7, the API 902 can provide access to a local or remote memory 910 (e.g. remote memory can be accessible through a network). The local or remote memory 910 can store GPU programs and FPGA bit streams 912 used to operate the SDR device 10.

The application layer 900 provides a common API to remote users connecting to the SDR device 10. The user can connect to the device for the purpose of receiving data from the SDR device 10, injecting data to be transmitted by SDR device 10, or for configuring the SDR device 10. It can be appreciated that the device 10 may be programmed to allow it to autonomously act to capture, transmit, store, or communicate with other devices. The application layer 900 also provides a means by which processed data may be sent over another, possibly lower bandwidth, connection to remote users. The application layer 900 can provide a mechanism by which remote users may access and retrieve stored data, as well as modify and program the behaviour of the device 10.

In one embodiment, the Web UI 906 is operable to allow communication between the SDR device 10 and a remote user over the internet. For example, connections to the SDR device 10 can be made through an internet communication protocol such as Transmission Control Protocol/Internet Protocol (TCP/IP). A user can remotely communicate with the SDR device 10 using a third party web browser or SDR specific computer software. In the example of a web browser, GPU programs and FPGA bit streams 912 can be transferred over the network using a networking protocol such as Hypertext Transfer Protocol (HTTP) POST commands. The Web UI 906 can receive GPU programs and send them to the GPU 16 via the SDR API 902 and GPU driver 326. The Web UI 906 can receive FPGA bitstreams and send them to the FPGA 14 via the SDR API 902 and the FPGA driver 328. The Web UI 906 can also be operable to allow a user to configure and control the behaviour of the SDR device 10 through HTTP GET commands, for example. The Web UI 906 can translate the HTTP GET commands to API calls for the SDR API 902.

It can be appreciated that software running on the SDR device 10 is not constrained to one physical component. It may run on the CPU 18, GPU 16, FPGA 14 and/or RF front end 12. Each physical component can perform a different computational task. For example, CPU 18 or FPGA 14 can provide a user interface, retrieve and store data from memory, and dynamically program and configure GPU 16 and RF front end 12. The GPU 16 can run computationally intensive tasks such as spectrum analysis and cryptanalysis. The RF front end 12 can provide the analog means necessary for a desired application.

It can also be appreciated that the SDR 10 can perform management activities. This can include using the signal or spectral information to manage the connection or communication itself. Management activity can also include monitoring the network or ambient RF environment to modify the communication protocols parameters to optimize transmission, reception and other communication characteristics. The SDR device 10 may be operable to redefine its transmission parameters independently, based on predefined algorithms or in concert with other devices. These cognitive algorithms may be calculated on the FPGA 14 or parallelized and calculated on the GPU 16.

Although the modules and components of the example configurations of the SDR device have been described with reference to specific embodiments that include an RF front end 12, FPGA 14, GPU 16, and CPU 18, it will be appreciated that other embodiments are contemplated, including implementations on any suitable circuit comprising one or more circuit components or any suitable processing unit capable of performing the operations described.

Although the invention has been described with reference to certain specific embodiments, various modifications thereof will be apparent to those skilled in the art without departing from the spirit and scope of the invention as outlined in the claims appended hereto. The entire disclosures of all references recited above are incorporated herein by reference.

What is claimed is:

1. A method of extracting and demodulating one or more channels in a radio signal, the method comprising:
   receiving a first radio signal using a radio frequency front end;
   translating a first band of frequencies of the first radio signal to a second band of frequencies to generate a second radio signal;
   digitizing the second radio signal to generate a digital signal;
   translating a third band of frequencies of the digital signal to a fourth band of frequencies to generate a processed digital signal and to reduce an error from translating the first band of frequencies of the first radio signal to the second band of frequencies;
   extracting one or more additional band of frequencies of the digital signal, each additional band of frequencies corresponding to a channel; and
   demodulating one or more of the channels to generate a respective demodulated signal.

2. The method of claim 1, wherein a plurality of additional band of frequencies of the digital signal are extracted in parallel.

3. The method of claim 1, wherein a plurality of channels are demodulated in parallel.

4. The method of claim 1 further comprising time domain averaging one or more demodulated signals.

5. The method of claim 1 further comprising frequency domain averaging one or more demodulated signals with one or more other demodulated signals.

6. The method of claim 1 further comprising:
   modulating one or more of the demodulated signals to generate a respective modulated signal;
   translating a third band of frequencies of one or more modulated signals to a sixth band of frequencies corresponding to an additional channel;
   combining one or more additional channels to generate a combined signal;
   converting the combined signal to an analog signal;
   translating a seventh band of frequencies of the analog signal to a transmitting band of frequencies to generate a third radio signal; and
   transmitting the third radio signal using the radio frequency front end.

7. The method of claim 6, wherein a plurality of demodulated signals are modulated in parallel.

8. The method of claim 6, wherein a plurality of third band of frequencies are translated in parallel.

9. The method of claim 6, wherein one or more demodulated signals are modulated using a modulation technique that does not correspond to the demodulation technique used to demodulate the channel corresponding to the demodulated signal.

10. The method of claim 6, wherein one or more channels have a different communication protocol than its corresponding additional channel.

11. A method of modulating and combining one or more channels into a radio signal, the method comprising:
    receiving one or more digital input signals;
    modulating one or more digital input signals to generate a respective modulated signal;
    translating a first band of frequencies of one or more modulated signals to a second band of frequencies corresponding to a channel;
    combining one or more of the channels to generate a combined signal;
    translating a third band of frequencies of the combined signal to a fourth band of frequencies to generate a processed combined signal and to improve a subsequent conversion of the processed combined signal to an analog signal;
    converting the combined signal to the analog signal;
    translating a fifth band of frequencies of the analog signal to a transmitting band of frequencies to generate the radio signal; and
    transmitting the radio signal using a radio frequency front end.

12. The method of claim 11, wherein a plurality digital input signals are modulated in parallel.

13. The method of claim 11, wherein a plurality of first band of frequencies are translated in parallel.

14. An electronic device for extracting and demodulating one or more channels in a radio signal, the electronic device comprising a radio frequency front end, a processing unit and memory, the memory storing computer executable instructions for:
    receiving a first radio signal using the radio frequency front end;
    translating a first band of frequencies of the first radio signal to a second band of frequencies to generate a second radio signal;
    digitizing the second radio signal to generate a digital signal;
    translating a third band of frequencies of the digital signal to a fourth band of frequencies to generate a processed digital signal and to reduce an error from translating the first band of frequencies of the first radio signal to the second band of frequencies;
    extracting one or more additional band of frequencies of the digital signal, each additional band of frequencies corresponding to a channel; and
    demodulating one or more channels to generate a respective demodulated signal.

15. The electronic device of claim 14, wherein the processing unit comprises a field programmable gate array in communication with the radio frequency front end for performing serial processing.

16. The electronic device of claim 15, wherein the processing unit further comprises a graphics processing unit in communication with the field programmable gate array for performing parallel processing.

17. The electronic device of claim 16, wherein at least one of the radio frequency front end, the field programmable gate array and the graphics processing unit is configured to receive data over a communication network.

18. The electronic device of claim 17, wherein the data includes configuration information for at least one of the radio frequency front end, the field programmable gate array and the graphics processing unit.

19. A computer readable storage medium for extracting and demodulating one or more channels in a radio signal, the computer readable storage medium comprising computer executable instructions for:
- receiving a first radio signal using a radio frequency front end;
- translating a first band of frequencies of the first radio signal to a second band of frequencies to generate a second radio signal;
- digitizing the second radio signal to generate a digital signal;
- translating a third band of frequencies of the digital signal to a fourth band of frequencies to generate a processed digital signal and to reduce an error from translating the first band of frequencies of the first radio signal to the second band of frequencies;
- extracting one or more additional band of frequencies of the digital signal, each additional band of frequencies corresponding to a channel; and
- demodulating one or more of the channels to generate a respective demodulated signal.

* * * * *